(12) United States Patent
Tsujita et al.

(10) Patent No.: US 8,739,079 B2
(45) Date of Patent: May 27, 2014

(54) RECORDING MEDIUM AND DETERMINATION METHOD

(75) Inventors: Kouichirou Tsujita, Utsunomiya (JP); Axelrad Valery, Woodside, CA (US)

(73) Assignee: Canon Kabushiki Kaisha (JP)

( * ) Notice: Subject to any disclaimer, the term of this patent is extended or adjusted under 35 U.S.C. 154(b) by 453 days.

(21) Appl. No.: 12/609,830

(22) Filed: Oct. 30, 2009

(65) Prior Publication Data

US 2011/0107277 A1 May 5, 2011

(51) Int. Cl.
*G06F 17/50* (2006.01)

(52) U.S. Cl.
USPC ............ 716/54; 716/51; 716/52; 716/53; 716/55

(58) Field of Classification Search
USPC .................... 716/50, 52, 53, 54, 55
See application file for complete search history.

(56) References Cited

U.S. PATENT DOCUMENTS

| | | | |
|---|---|---|---|
| 6,128,089 A * | 10/2000 | Ausschnitt et al. | 356/401 |
| 6,563,566 B2 | 5/2003 | Rosenbluth et al. | |
| 7,807,323 B2 * | 10/2010 | Fukuhara | 430/30 |
| 2007/0234246 A1 * | 10/2007 | Sinha et al. | 716/4 |
| 2007/0238038 A1 * | 10/2007 | Fukuhara | 430/30 |
| 2008/0151210 A1 * | 6/2008 | Tsujita | 355/67 |
| 2009/0091736 A1 * | 4/2009 | Yamazoe | 355/77 |
| 2009/0093099 A1 * | 4/2009 | Kobayashi | 438/403 |
| 2009/0319967 A1 * | 12/2009 | Sakamoto | 716/4 |
| 2010/0102255 A1 * | 4/2010 | Tsujita et al. | 250/492.22 |

FOREIGN PATENT DOCUMENTS

| | | |
|---|---|---|
| JP | 2004-079714 A | 3/2004 |
| JP | 200666440 A | 3/2006 |
| JP | 2007305972 A | 11/2007 |
| WO | 2006/118098 A1 | 11/2006 |
| WO | 2006118098 A1 | 11/2006 |

OTHER PUBLICATIONS

JP Office Action issued Jun. 22, 2012 for corresponding JP2010-207153.
Japanese Office Action issued in counterpart application No. JP2010-207153, dated Jun. 22, 2012.

* cited by examiner

*Primary Examiner* — Vuthe Siek
*Assistant Examiner* — Brian Ngo
(74) *Attorney, Agent, or Firm* — Rossi, Kimms & McDowell

(57) ABSTRACT

The present invention provides a computer-readable recording medium recording a program for causing a computer to execute a method of determining a pattern of a mask and an effective light source distribution with which the mask is illuminated, both of which are used for an exposure apparatus including an illumination optical system which illuminates a mask with light from a light source and a projection optical system which projects a pattern of the mask onto a substrate.

7 Claims, 21 Drawing Sheets

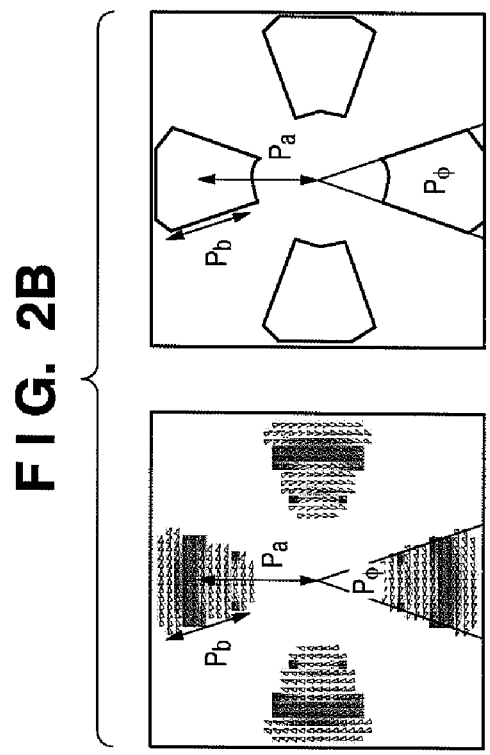
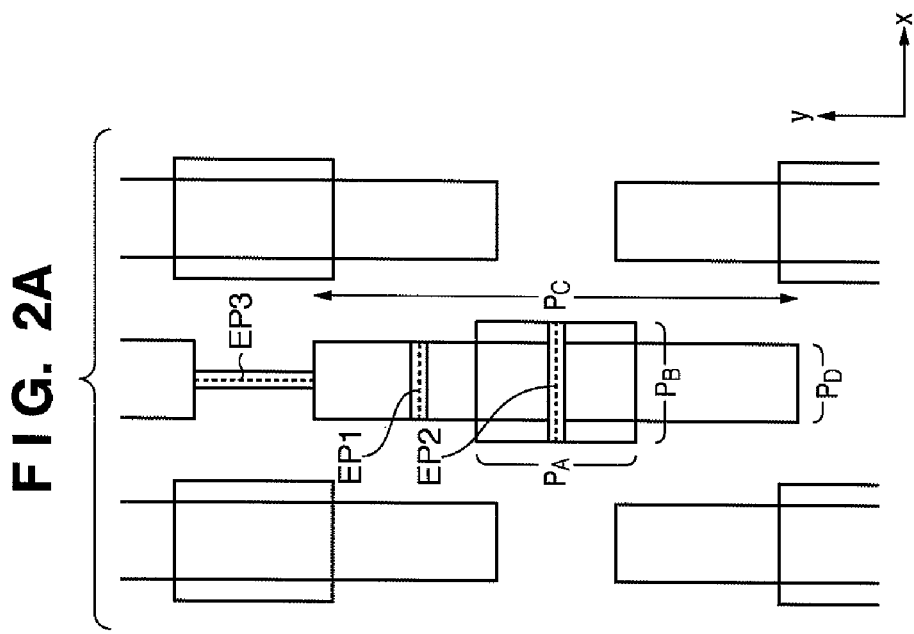

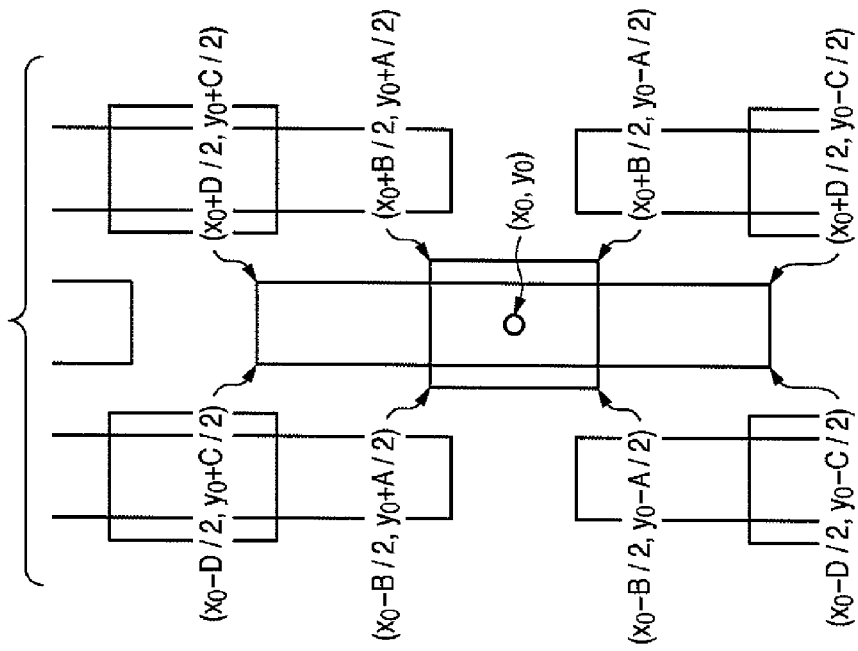
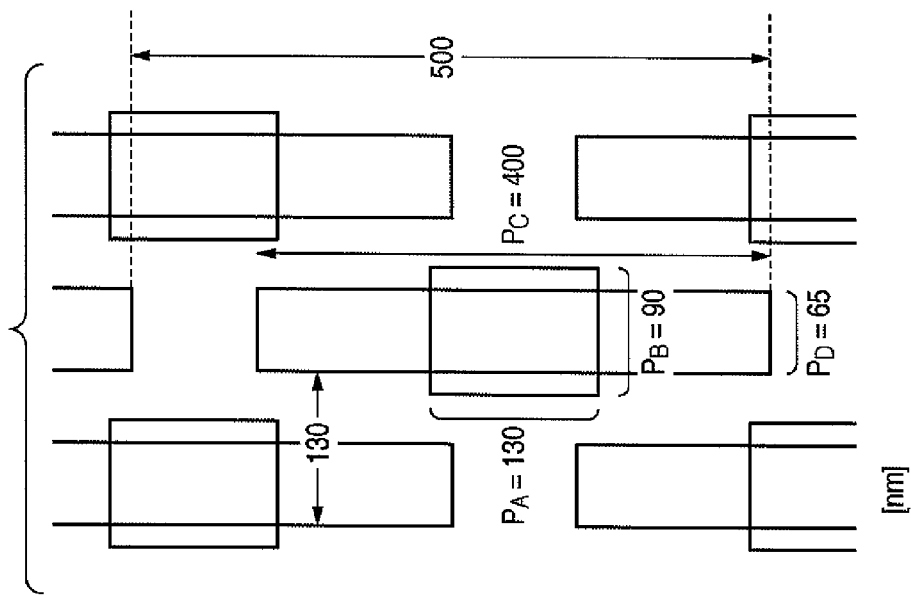

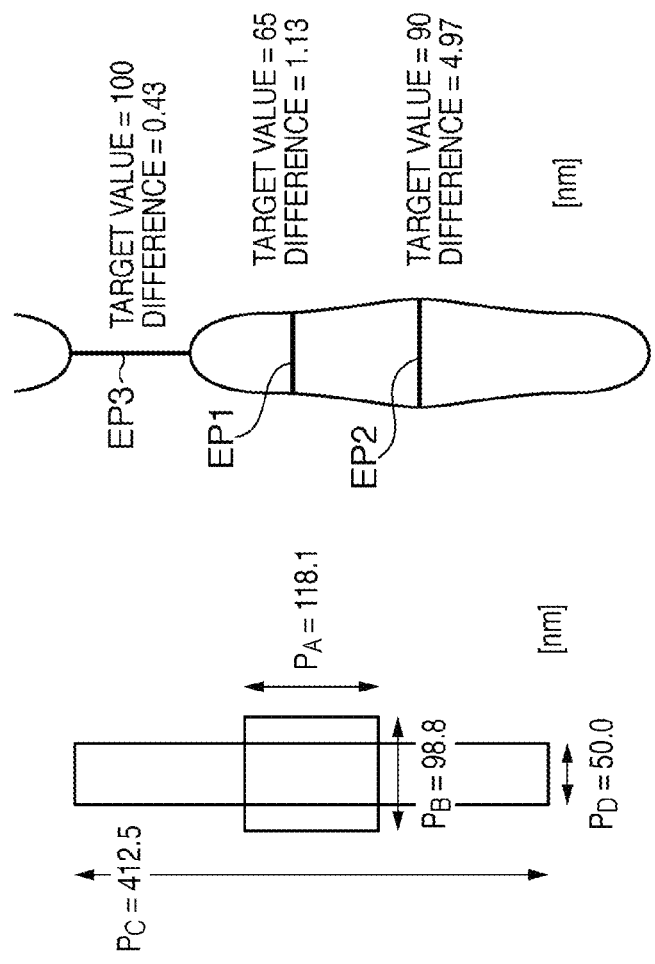

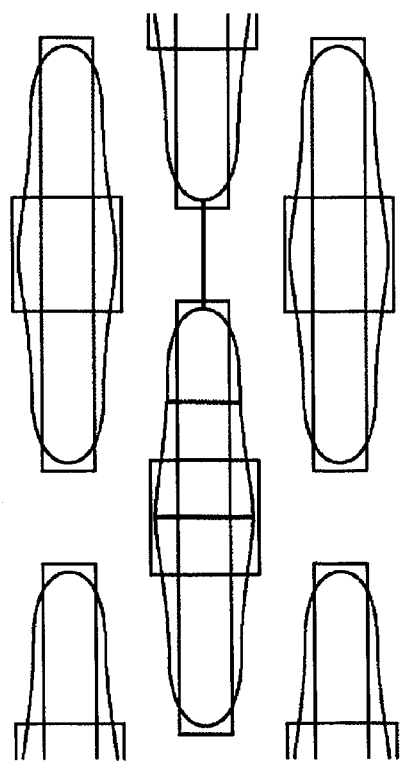
F I G. 7D

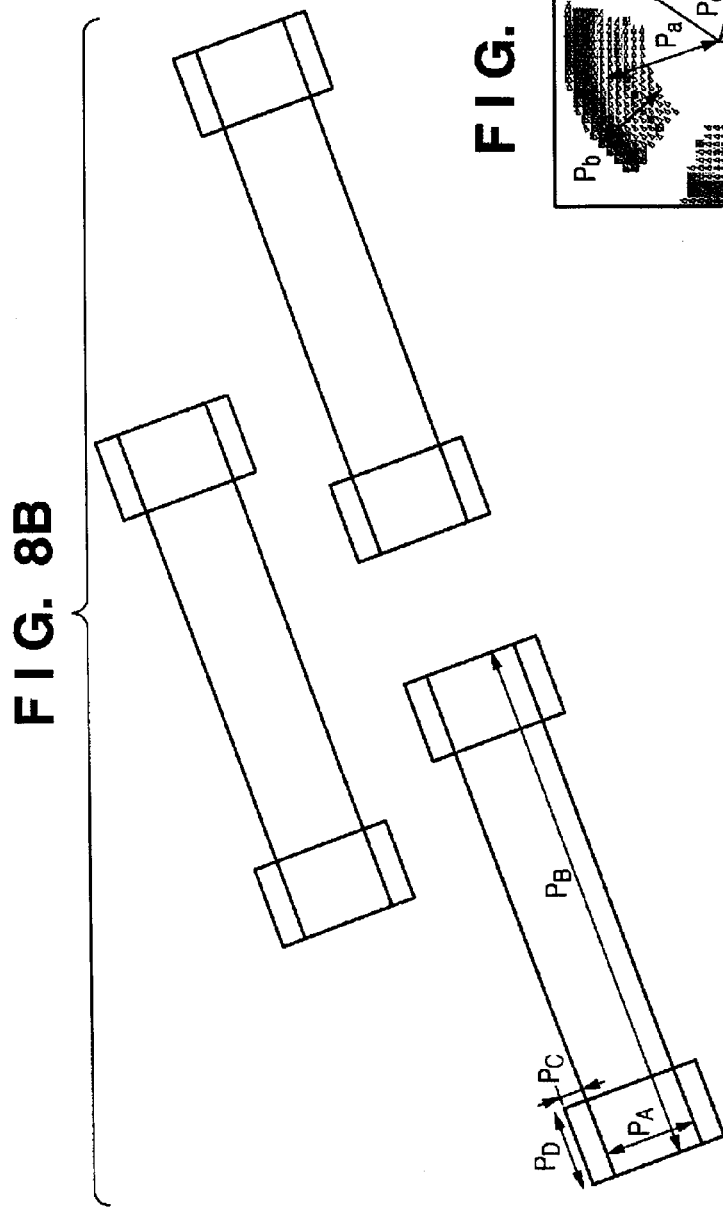
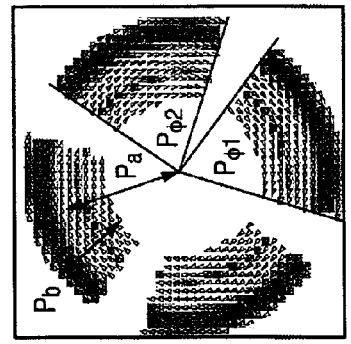

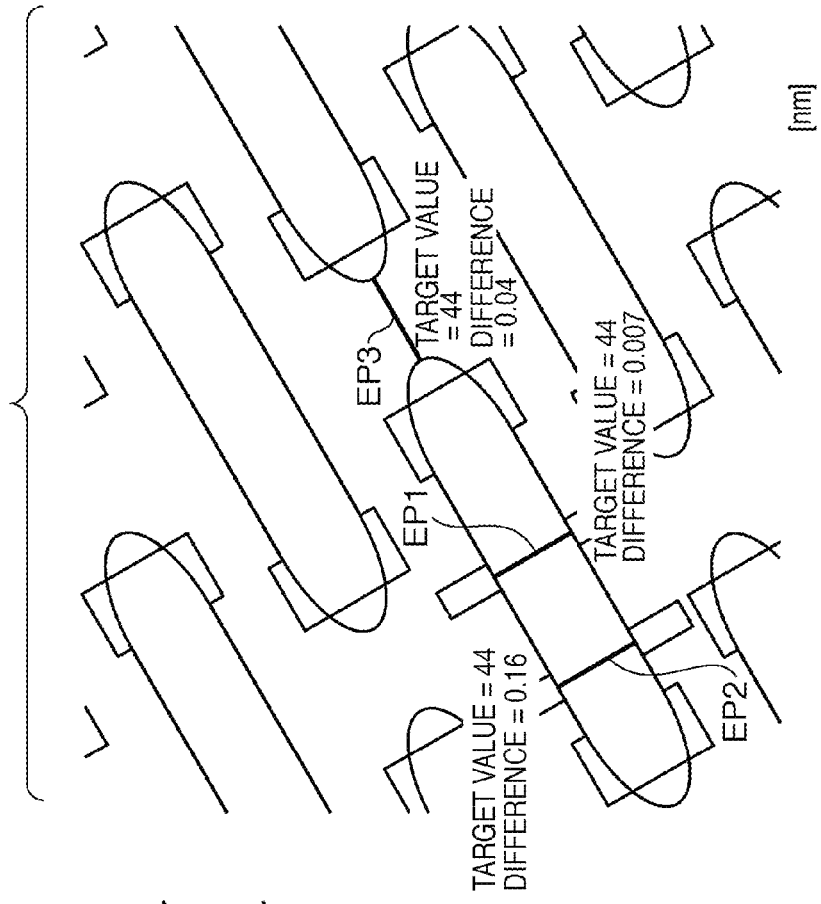
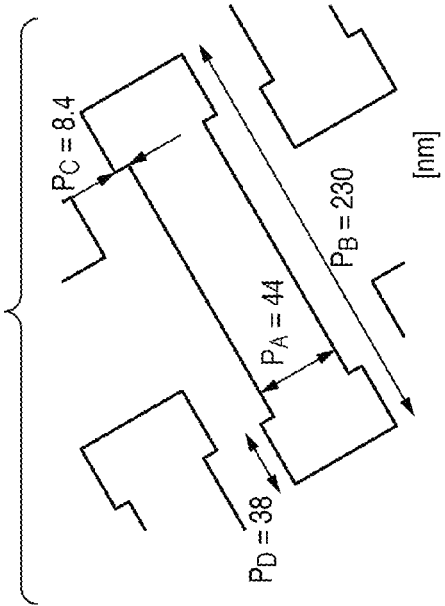
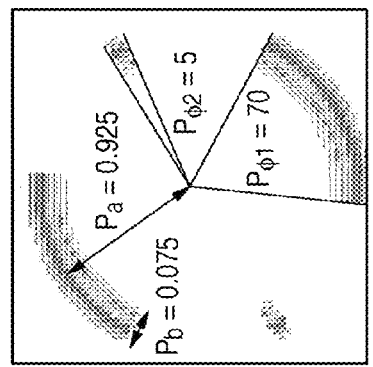

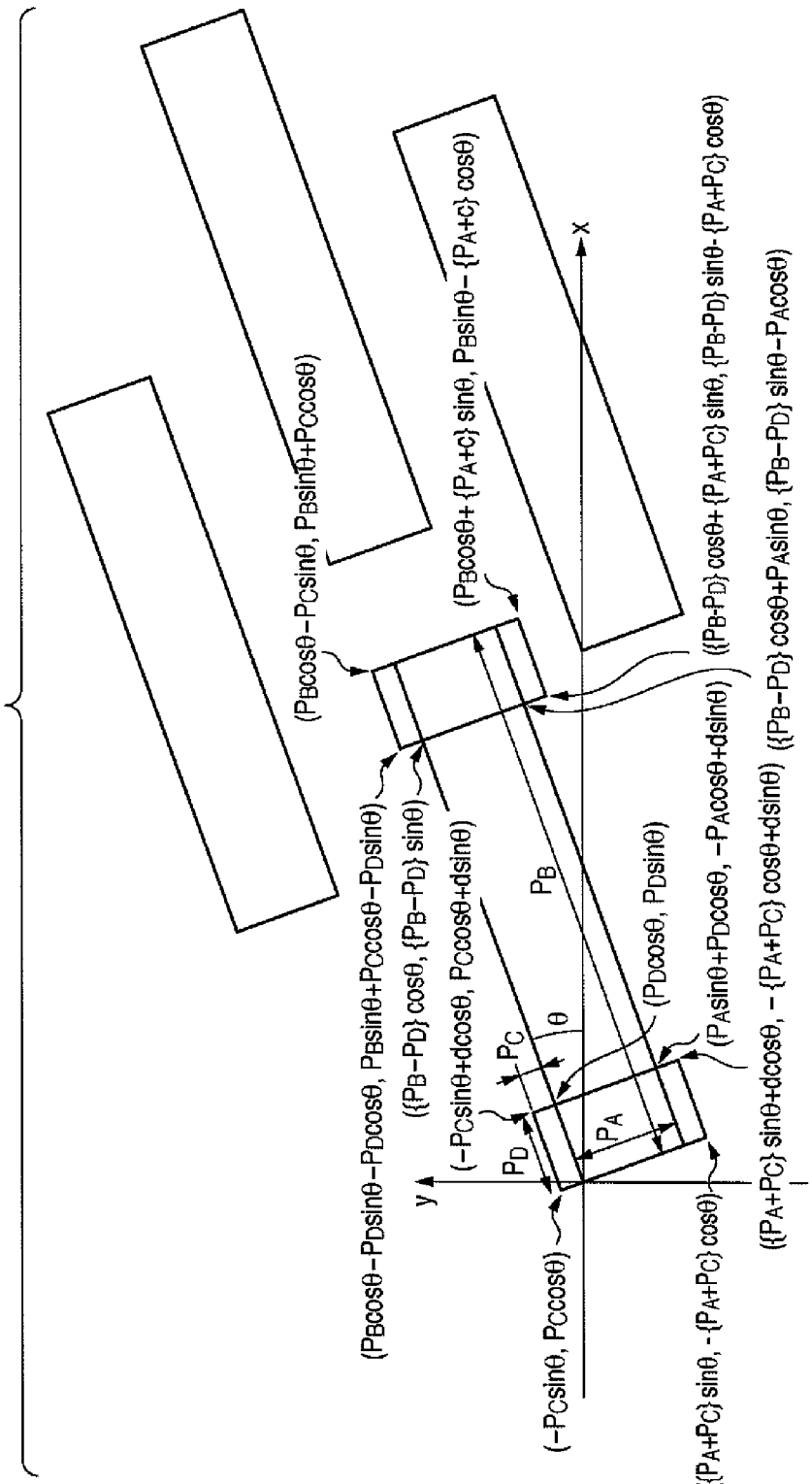

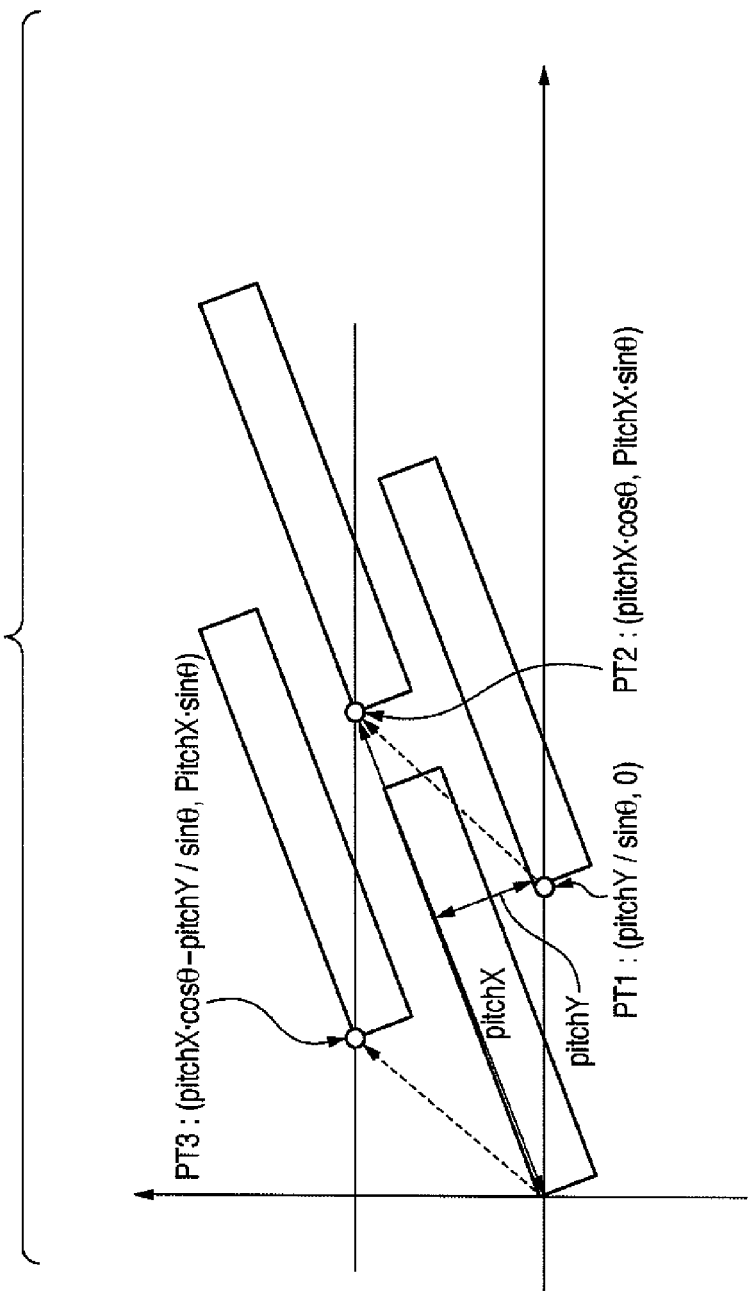

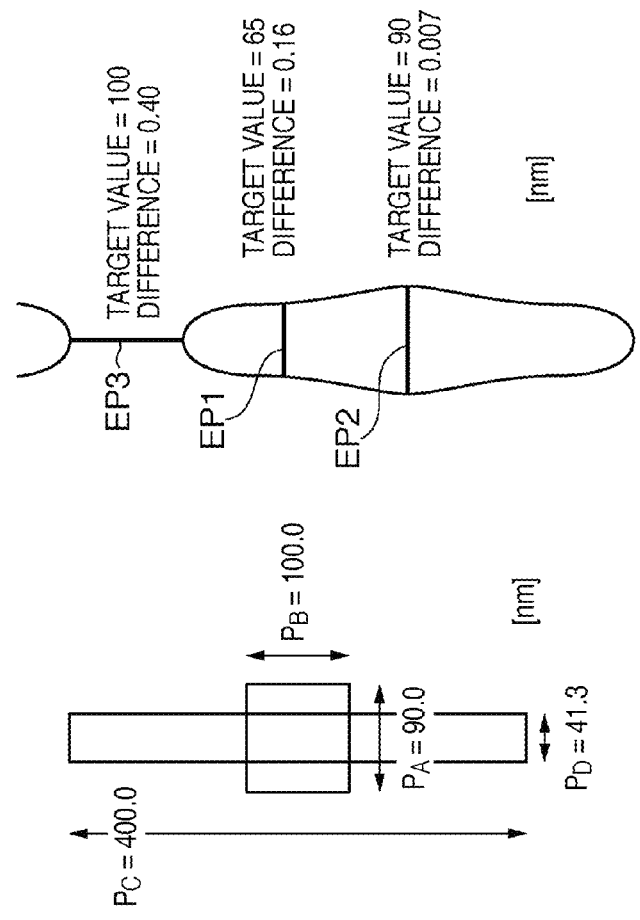

RECORDING MEDIUM AND DETERMINATION METHOD

BACKGROUND OF THE INVENTION

1. Field of the Invention

The present invention relates to a recording medium and a determination method.

2. Description of the Related Art

Along with the recent miniaturization of semiconductor devices, it has become difficult for an exposure apparatus to transfer (resolve) patterns corresponding to such microdevices. Under the circumstance, to keep up with miniaturization of semiconductor devices, an exposure apparatus employs resolution enhanced technologies such as modified illumination and OPC (Optical Proximity Correction) and technology optimizing the pattern of a mask and the illumination shape (effective light source distribution) with which the mask is illuminated. The illumination shape (effective light source distribution) is a light intensity distribution formed on the pupil plane of an illumination optical system and is also the angular distribution of light which illuminates a mask.

To optimize the illumination shape, the device layout pattern (target pattern), the evaluation positions in a transfer pattern (optical image), and the evaluation values (e.g., the dimensions, the DOF, and the exposure margin) at the evaluation positions are set first. Next, a transfer pattern is calculated while changing the illumination shape, and the evaluation values at the evaluation positions in the transfer pattern are obtained. The transfer pattern calculation and the evaluation value obtaining are repeated until the evaluation values satisfy evaluation references (evaluation criterions) or the number of times of change in illumination shape reaches a predetermined number. The illumination shape is expressed numerically. For example, annular illumination having a constant intensity is expressed by a function having inner σ and outer σ as parameters (variables), and these parameters are optimized using, for example, a Monte Carlo method. Note that the same pattern naturally yields different transfer patterns when different illumination shapes are used, so the transfer pattern shifts from the target pattern upon changing the illumination shape. For this reason, OPC for matching the transfer pattern with the target pattern is necessary in that case. OPC is performed every time the illumination shape is changed or when the illumination shape is changed by a predetermined amount.

Also, U.S. Pat. No. 6,563,566 (to be referred to as "patent reference 1" hereinafter) proposes a technique of setting a pattern to be formed on a substrate (wafer) and calculating a mathematically optimized mask pattern and illumination shape. The technique in patent reference 1 analytically calculates the solutions (the mask pattern and illumination shape) instead of repetitive computation. Although the technique in patent reference 1 does not adopt OPC, it is an illumination shape optimization technique including mask pattern correction in a broad sense because it copes with a situation in which a pattern to be formed on a substrate (for example, a wafer) is different from an optimized mask pattern. The technique in patent reference 1 has a merit of analytically calculating the solutions, but requires limiting the evaluation value to the tilt of an optical image and, additionally, limiting the number of types of patterns to be formed on a substrate to one. In this manner, the technique in patent reference 1 is impracticable because it has a demerit that there exist small degrees of freedom.

Moreover, Japanese Patent Laid-Open No. 2004-079714 proposes a technique of optimizing the mask pattern and illumination shape in this way.

Unfortunately, the conventional techniques that relate to optimization of the mask pattern and illumination shape cannot form patterns, which are rapidly becoming finer, with a sufficiently high accuracy. This is because the conventional techniques separately optimize the mask pattern and illumination shape (i.e., do not optimize them at once). As described above, factors associated with OPC depend on the illumination shape, so it is generally performed after determining (optimizing) the illumination shape. However, it is often the case that the mask pattern deforms upon OPC and so the illumination shape determined before the OPC becomes no longer optimum after the OPC.

SUMMARY OF THE INVENTION

The present invention provides a technique that can determine the pattern of a mask and the effective light source distribution with which the mask is illuminated, both of which can form a pattern on a substrate with a sufficiently high accuracy.

According to one aspect of the present invention, there is provided a computer-readable recording medium recording a program for causing a computer to execute a method of determining a pattern of a mask and an effective light source distribution with which the mask is illuminated, both of which are used for an exposure apparatus including an illumination optical system which illuminates a mask with light from a light source and a projection optical system which projects a pattern of the mask onto a substrate, the program causing the computer to execute a first setting step of setting a first parameter to define a shape of a temporary pattern corresponding to a pattern to be formed on the substrate, a second setting step of setting an evaluation position, to evaluate an image of the temporary pattern formed on an image plane of the projection optical system, in the image of the temporary pattern, and an evaluation item evaluated at the evaluation position, a third setting step of setting a second parameter to define a temporary effective light source distribution, a temporary determination step of temporarily determining a value of the first parameter and a value of the second parameter, a first obtaining step of obtaining an image of the temporary pattern formed on the image plane of the projection optical system upon illuminating, the temporary pattern defined by the value of the first parameter temporarily determined in the temporary determination step, with the temporary effective light source distribution defined by the value of the second parameter temporarily determined in the temporary determination step, a second obtaining step of obtaining, a value of the evaluation item evaluated at the evaluation position set in the second setting step, for the image of the temporary pattern obtained in the first obtaining step, and a decision step of deciding whether the value of the evaluation item evaluated at the evaluation position, obtained in the second obtaining step, satisfies an evaluation reference, wherein if it is decided in the decision step that the value of the evaluation item evaluated at the evaluation position satisfies the evaluation reference, the temporary pattern defined by the value of the first parameter temporarily determined in the temporary determination step, and the temporary effective light source distribution defined by the value of the second parameter temporarily determined in the temporary determination step are determined as the pattern of the mask and the effective light source distribution, respectively, and if it is decided in the decision step that the value of the evaluation item evaluated at the evaluation position does not satisfy the evaluation reference, a process returns to the temporary determination step, in which the value of the first parameter and the value of the second parameter are temporarily determined again, and the first obtaining step, the second obtaining step, and the decision step are repeated.

Further features of the present invention will become apparent from the following description of exemplary embodiments with reference to the attached drawings.

BRIEF DESCRIPTION OF THE DRAWINGS

FIG. 2A is a view showing a target pattern (its shape) in the first embodiment.

FIG. 2B is a view showing an illumination shape in the first embodiment.

FIG. 6A is a view showing pattern parameters for the target pattern shown in FIG. 2A, the representative values of these pattern parameters, and the pitches of target patterns in the x and y directions.

FIG. 6B is a view showing the result of expressing the vertices of two rectangles which form the target pattern shown in FIG. 2A as functions using the side lengths of these two rectangles.

FIG. 7A is a view showing an illumination shape in the second embodiment.

FIG. 7B is a view showing a pattern defined by pattern parameters optimized in the second embodiment.

FIG. 7C is a view showing a pattern image (transfer pattern) formed upon illuminating the pattern defined by the pattern parameters, shown in FIG. 7B, with the illumination shape defined by the illumination shape parameters, shown in FIG. 7A.

FIG. 7D is a view showing the result of superposing the pattern defined by the pattern parameters, shown in FIG. 7B, and the pattern image shown in FIG. 7C on each other.

FIG. 8B is a view showing parameters set for the target pattern shown in FIG. 8A.

FIG. 8C is a view showing an illumination shape in the third embodiment.

FIG. 8D is a view showing a pattern defined by pattern parameters optimized in the third embodiment.

FIG. 8E is a view showing an illumination shape defined by illumination shape parameters optimized in the third embodiment.

FIG. 8F is a view showing the result of superposing on each other the pattern defined by the pattern parameters, shown in FIG. 8D, and a pattern image (transfer pattern) formed upon illuminating the pattern shown in FIG. 8D with the illumination shape defined by the illumination shape parameters, shown in FIG. 8E;

FIG. 9A is a view for explaining a pattern parameter setting method according to the third embodiment.

FIG. 9B is a view for explaining the pattern parameter setting method according to the third embodiment.

FIG. 10A is a view showing an illumination shape defined by illumination shape parameters optimized in the fourth embodiment.

FIG. 10B is a view showing a pattern defined by pattern parameters optimized in the fourth embodiment.

FIG. 10C is a view showing a pattern image (transfer pattern) formed upon illuminating the pattern defined by the pattern parameters, shown in FIG. 10B, with the illumination shape defined by the illumination shape parameters, shown in FIG. 10A.

DESCRIPTION OF THE EMBODIMENTS

Figure 1:
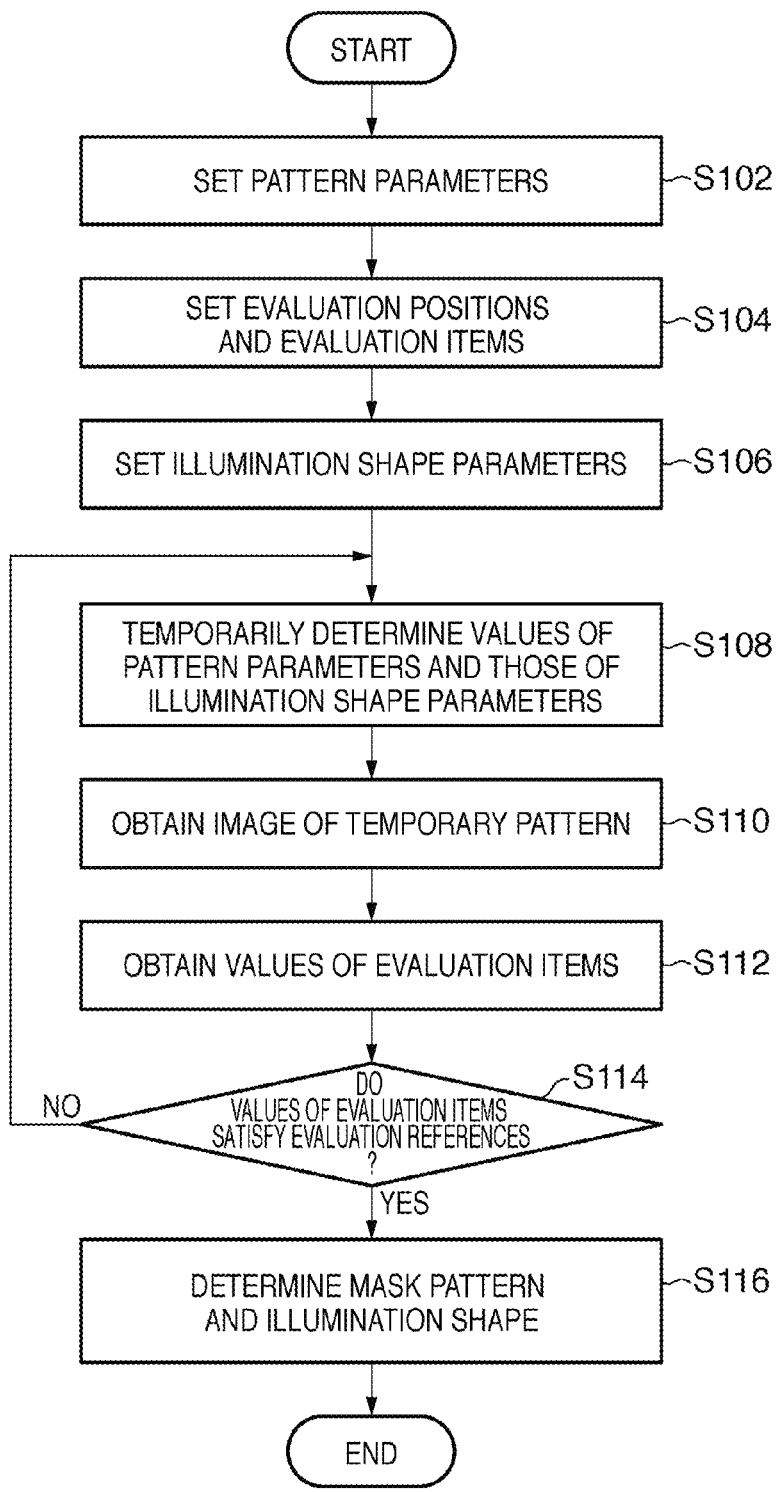
FIG. 1 is a flowchart for explaining a determination method according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a flowchart for explaining a determination method according to one aspect of the present invention. This determination method determines (optimizes) the pattern of a mask and the illumination shape with which the mask is illuminated, both of which are used for an exposure apparatus including an illumination optical system which illuminates a mask with light from a light source and a projection optical system which projects the pattern of the mask onto a substrate (for example, a wafer). Also, the determination method is performed by an information processing apparatus including, for example, a general-purpose computer. Note that the illumination shape (effective light source distribution) is a light intensity distribution formed on the pupil plane of an illumination optical system and is also the angular distribution of light which illuminates a mask.

In step S102 (first setting step), pattern parameters (first parameters) to define the shape of a temporary pattern corresponding to a pattern (target pattern) to be formed on a substrate are set. More specifically, a target pattern is formed from a plurality of polygons, and parameters which characterize these polygons are set as pattern parameters. For example, the shape of a target pattern is matched with that formed by a combination of a plurality of polygons, and the side lengths of the plurality of polygons are set as pattern parameters.

In step S104 (second setting step), the evaluation positions to evaluate an image of the temporary pattern (i.e., a transfer pattern) formed on the image plane of the projection optical system, and the evaluation items evaluated at the evaluation positions are set. The evaluation items mentioned herein include, for example, at least one of the dimensions of an image of the temporary pattern, the defocus characteristic of the image of the temporary pattern, dimensional changes of the image of the temporary pattern for the exposure dose, and the exposure dose and focus range in which the image of the temporary pattern meets a standard.

In step S106 (third setting step), illumination shape parameters (second parameters) to define a temporary illumination shape are set. For example, parameters which characterize the basic illumination shape (for example, a dipole shape or a quadrupole (cross-pole) shape) are set as illumination shape parameters.

In steps S108 to S116, a parameter space including the pattern parameters set in step S102 and the illumination shape parameters set in step S106 is formed, and the pattern parameters and the illumination shape parameters are optimized in the parameter space. Note that both the pattern parameters and the illumination shape parameters have limit ranges and therefore need to be optimized within their limit ranges.

In step S108 (temporary determination step), the values of the pattern parameters and those of the illumination shape parameters are temporarily determined. The determination method according to this embodiment adjusts the values of the pattern parameters and those of the illumination shape parameters to optimal values while changing them. This makes it possible to temporarily determine arbitrary values as the values of the pattern parameters and those of the illumination shape parameters within their limit ranges.

In step S110 (first obtaining step), an image of the temporary pattern formed on the image plane of the projection optical system is obtained (calculated) based on the values of the pattern parameters and those of the illumination shape parameters temporarily determined in step S108. More specifically, an image of the temporary pattern formed upon illuminating, the temporary pattern defined by the values of the pattern parameters temporarily determined in step S108, with the temporary illumination shape defined by the values of the illumination shape parameters temporarily determined in step S108 is obtained.

In step S112 (second obtaining step), the values of the evaluation items evaluated at the evaluation positions set in step S104 are obtained (calculated) for the image of the temporary pattern obtained in step S110.

In step S114 (decision step), it is decided whether the values of the evaluation items evaluated at the evaluation positions in the image of the temporary pattern, obtained in step S112, satisfy evaluation references. Note that the evaluation reference is set in advance for each evaluation item in accordance with, for example, the precision of a pattern to be formed on a substrate and the performance of an exposure apparatus.

If the values of the evaluation items evaluated at the evaluation positions in the image of the temporary pattern satisfy the evaluation references, the process advances to step S116. In step S116, the temporary pattern defined by the values of the pattern parameters temporarily determined in step S108 and the temporary illumination shape defined by the values of the illumination shape parameters temporarily determined in step S108 are determined as the pattern of a mask and the illumination shape with which the mask is illuminated, respectively.

If the values of the evaluation items evaluated at the evaluation positions in the image of the temporary pattern do not satisfy the evaluation references, the process returns to step S108, in which the values of the pattern parameters and those of the illumination shape parameters are temporarily determined again, and steps S110, S112, and S114 are repeated. In other words, the values of the pattern parameters and those of the illumination shape parameters are changed, and the processes in steps S110, S112, and S114 are repeated until the values of the evaluation items evaluated at the evaluation positions in the image of the temporary pattern satisfy the evaluation references. Note that values of the pattern parameters and those of the illumination shape parameters, both of which have never been temporarily determined in combination with each other before the present time, are temporarily determined. For this reason, not both but either the values of the pattern parameters and those of the illumination shape parameters may be changed.

In this manner, the determination method according to this embodiment can determine (optimize) the pattern of a mask (pattern parameters) and the illumination shape (illumination shape parameters), both of which can form a pattern on a substrate with a sufficiently high accuracy.

The determination method according to this embodiment will be described in detail below in the first to sixth embodiments.

<First Embodiment>

The first embodiment will exemplify the pattern of a memory cell in a DRAM isolation process as a pattern (target pattern) to be formed on a substrate. FIG. 2A is a view showing a target pattern (its shape) in the first embodiment. Referring to FIG. 2A, the target pattern includes two rectangles having the same center. Also, target patterns are arranged at a pitch of 130 nm in the x direction and a pitch of 500 nm in the y direction. Side lengths (dimensions in the x and y directions) $P_A$, $P_B$, $P_C$, and $P_D$ of the two rectangles were set as pattern parameters, as shown in FIG. 2A, for the target pattern in the first embodiment.

Also, the illumination shape (its basic shape) with which the mask is illuminated is a quadrupole shape, as shown in FIG. 2B. The illumination shape shown in FIG. 2B conforms to a Gaussian distribution having the same intensities along zones in the circumferential directions and the same angle of aperture. A central position $P_a$, full width at half maximum $P_b$, and angle of aperture $P_\phi$ of the illumination shape are set as illumination shape parameters for the illumination shape in the first embodiment. The polarization direction in the illumination shape shown in FIG. 2B is the direction of tangential polarization. Note that a left view in FIG. 2B shows data on an actual illumination shape, and a right view in FIG. 2B shows a schematic illumination shape for explaining illumination shape parameters.

The limit ranges of the pattern parameters are set by taking account of the device characteristics and the mask productivity. A device is fabricated by forming a hole in a rectangular region, defined by the pattern parameters $P_A$ and $P_B$, in a post-process. Considering that the hole is formed to be larger than a design value, and a positional shift of the hole, it is necessary to set a relatively wide width for the rectangular region defined by the values of the pattern parameters $P_A$ and $P_B$. However, note that, when the values of the pattern parameters $P_A$ and $P_B$ are too large, the interval between adjacent patterns narrows, resulting in a resolution failure. To prevent this, the upper and lower limits of the pattern parameters are appropriately set in accordance with, for example, the pattern dimensions, the pattern overlay accuracy, and the device tolerance. Note that, because the dimensions of lines and spaces of mask have lower limits, the upper and lower limits of the pattern parameters are set such that the dimensions of lines and spaces do not fall below their lower limits from the viewpoint of the degree of difficulty of mask fabrication and the yield of masks.

The limit ranges of the illumination shape parameters are similarly set by taking account of the performance of an exposure apparatus and the lithography characteristics. If certain values of the illumination shape parameters can define their corresponding illumination shape but the exposure apparatus (illumination optical system) cannot form that shape, these values are impracticable. Accordingly, the upper and lower limits of the illumination shape parameters are set within the range in which the exposure apparatus can form their corresponding illumination shape.

Optimization (determination) of the mask pattern and illumination shape when the wavelength of exposure light is 193 nm and the numerical aperture (NA) of a projection optical system is 0.93 for the target pattern shown in FIG. 2A and the illumination shape (temporary illumination shape) shown in FIG. 2B will be explained. The evaluation positions to evaluate an image of a temporary pattern corresponding to the target pattern were set to evaluation positions EP1, EP2, and EP3, as shown in FIG. 2A, and the evaluation items were set to the dimensions of the image of the temporary pattern. Note that the ideal dimensions (target values) at the evaluation positions EP1, EP2, and EP3 are 65 nm, 90 nm, and 100 nm, respectively.

Taking account of the device characteristics and the mask productivity, the limit ranges of the pattern parameters were set to 130 nm$<P_A<$180 nm, 90 nm$<P_B<$120 nm, 400 nm$<P_C<$435 nm, and 64 nm$<P_D<$70 nm. Also, the limit ranges of the illumination shape parameters were set to 0.7$<P_a<$1.0, 0.2$<P_b<$0.4, and 0°$<P_\phi<$90°.

With this setting, a parameter space ($P_A$, $P_B$, $P_C$, $P_D$, $P_a$, $P_b$, $P_\phi$) including the pattern parameters and illumination shape parameters was formed to optimize them. The optimized illumination shape parameters were $P_a=0.95$, $P_b=0.072$, and $P_\phi=40$, as shown in FIG. 3A. The optimized pattern parameters were $P_A=104.1$ nm, $P_B=100.0$ nm, $P_C=400.0$ nm, and $P_D=51.3$ nm, as shown in FIG. 3B.

Figure 3C:
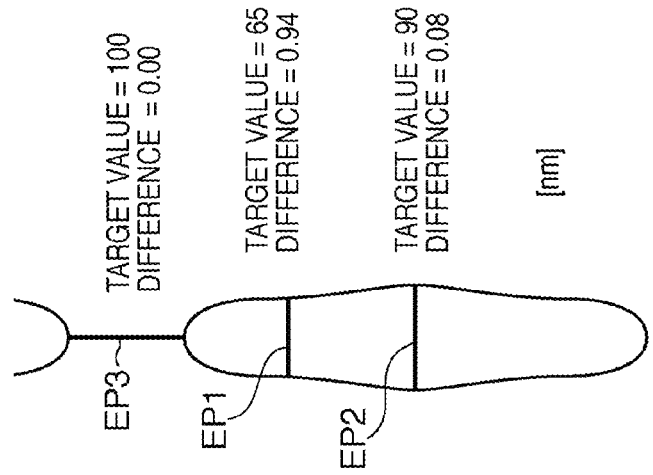
FIG. 3C is a view showing a pattern image (transfer pattern) formed upon illuminating the pattern defined by the pattern parameters, shown in FIG. 3B, with the illumination shape defined by the illumination shape parameters, shown in FIG. 3A.
Figure 3B:
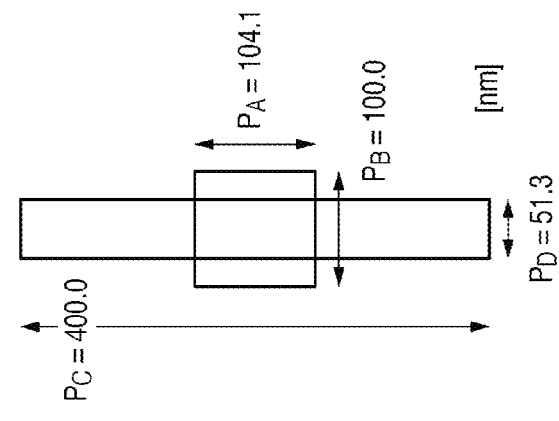
FIG. 3B is a view showing a pattern defined by pattern parameters optimized in the first embodiment.
Figure 3A:
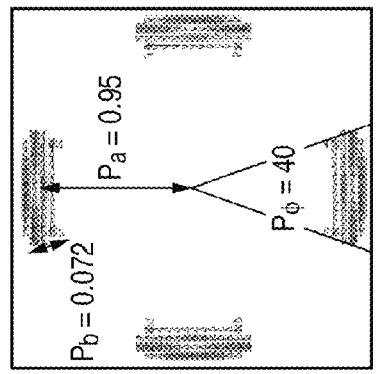
FIG. 3A is a view showing an illumination shape defined by illumination shape parameters optimized in the first embodiment.
Figure 3D:
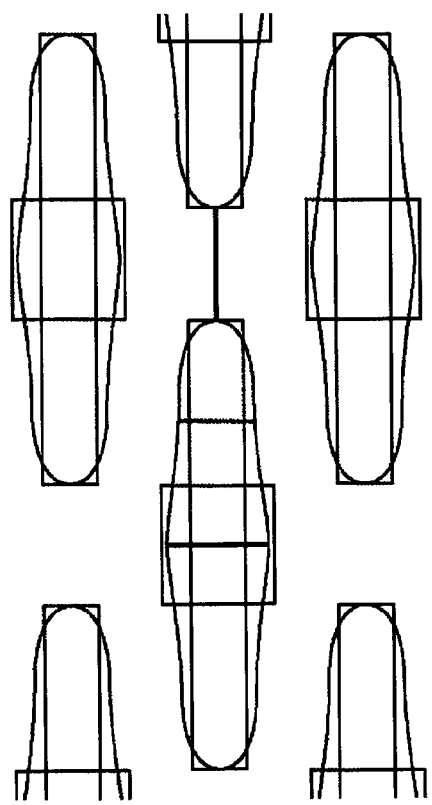
FIG. 3D is a view showing the result of superposing the pattern defined by the pattern parameters, shown in FIG. 3B, and the pattern image shown in FIG. 3C on each other.

FIG. 3C shows a pattern image (transfer pattern) formed on the image plane of the projection optical system upon illuminating the pattern defined by the pattern parameters, shown in FIG. 3B, with the illumination shape defined by the illumination shape parameters, shown in FIG. 3A. Also, FIG. 3D shows the result of superposing the pattern defined by the pattern parameters, shown in FIG. 3B, and the pattern image shown in FIG. 3C on each other. Referring to FIGS. 3C and 3D, the differences between the dimensions of the transfer pattern and their target values were 0.094 nm at the evaluation position EP1, 0.080 nm at the evaluation position EP2, and 0.000 nm at the evaluation position EP3. Also, the overall rms was 0.54 nm and this means that a very good optimization result was obtained in this embodiment.

Figure 4C:
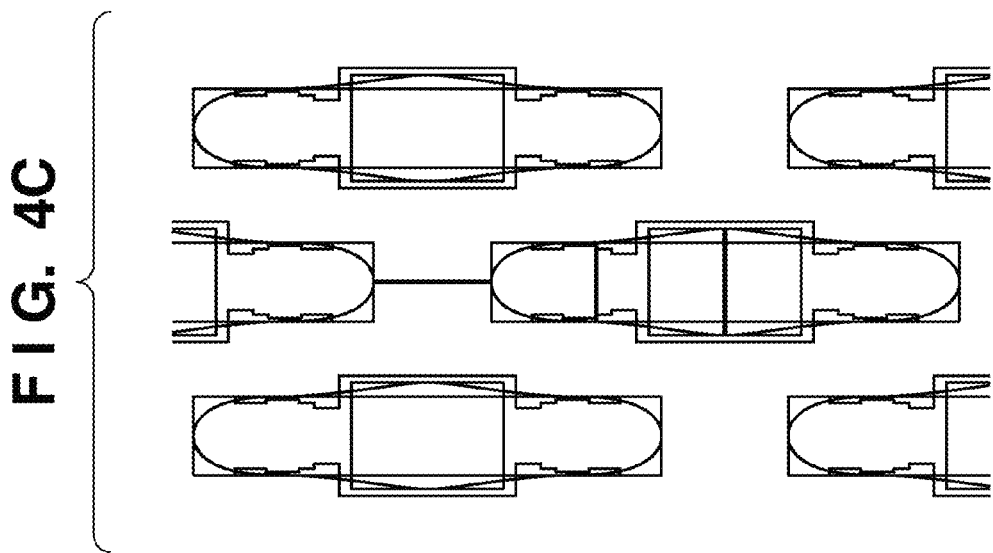
FIG. 4C is a view showing the result of superposing the target pattern shown in FIG. 2A, the pattern shown in FIG. 4A, and the pattern image shown in FIG. 4B on each other.
Figure 4B:
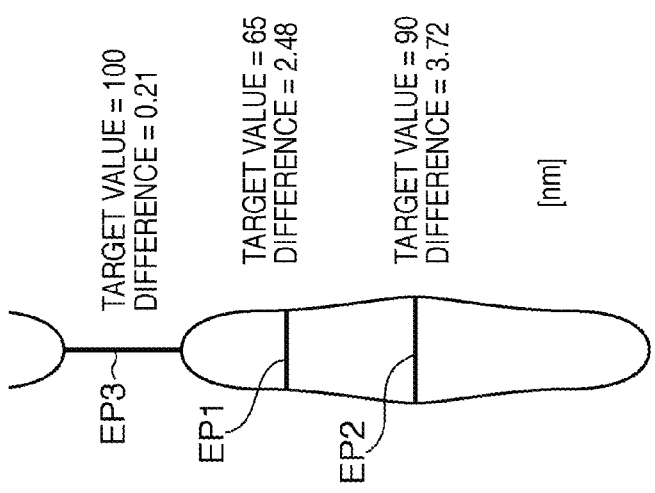
FIG. 4B is a view showing a pattern image (transfer pattern) formed upon illuminating the pattern shown in FIG. 4A with the illumination shape defined by the illumination shape parameters, shown in FIG. 3A.
Figure 4A:
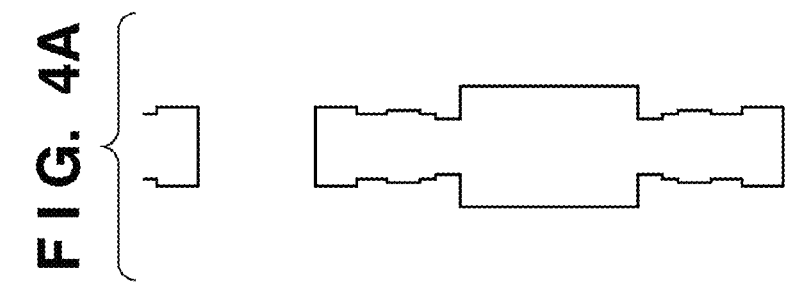
FIG. 4A is a view showing a pattern obtained when OPC is applied to the target pattern shown in FIG. 2A.

In contrast, when OPC is applied to the target pattern shown in FIG. 2A, a pattern as shown in FIG. 4A is obtained. FIG. 4B shows a pattern image (transfer pattern) formed on the image plane of the projection optical system upon illuminating the pattern shown in FIG. 4A with the illumination shape defined by the illumination shape parameters, shown in FIG. 3A. Also, FIG. 4C shows the result of superposing the target pattern shown in FIG. 2A, the pattern shown in FIG. 4A, and the pattern image shown in FIG. 4B on each other. Referring to FIGS. 4B and 4C, the differences between the dimensions of the transfer pattern and their target values were 2.48 nm at the evaluation position EP1, 3.72 nm at the evaluation position EP2, and 0.21 nm at the evaluation position EP3. Also, the overall rms was 2.58 nm and this means that a result poorer than that in this embodiment (see FIG. 3C) was obtained in the OPC.

In this manner, the determination method according to this embodiment can determine the pattern of a mask and the illumination shape with which the mask is illuminated, both of which can form a pattern on a substrate with a sufficiently high accuracy.

Also, excellent dimensional precision (dimensional controllability) is attained, as described above, although the mask pattern defined by the pattern parameters, shown in FIG. 3B, is simpler than that shown in FIG. 4A. Because such a simple mask is naturally easy to fabricate, the mask fabrication cost can be reduced.

Excellent dimensional precision is expected to be achieved using a simple mask in this embodiment for the following two reasons. First, because the illumination shape influences the optical proximity effect, the mask pattern can be adjusted by effectively exploiting the optical proximity effect by determining (optimizing) both the mask pattern and the illumination shape. Second, the mask pattern and the illumination shape are determined by evaluating only the dimensions at the evaluation positions in this embodiment, whereas OPC adjusts the mask pattern so that the transfer pattern has the same shape as that of a target pattern throughout the entire periphery of the mask pattern. In other words, OPC adjusts the mask pattern even at positions other than the evaluation positions, so the dimensional precision is relatively poor at the evaluation positions. Since the evaluation positions normally include all positions necessary to maintain a given device performance, there is no need to take account of the dimensions at positions other than the evaluation positions.

A method of optimizing the pattern parameters and the illumination shape parameters in the parameter space ($P_A$, $P_B$, $P_C$, $P_D$, $P_a$, $P_b$, $P_\phi$) will be explained herein. Optimal parameters are basically determined by detecting the directionality at which the values of the evaluation items evaluated at the evaluation positions are expected to be best while changing the values of the respective parameters, and repeating this detection.

Figure 5:
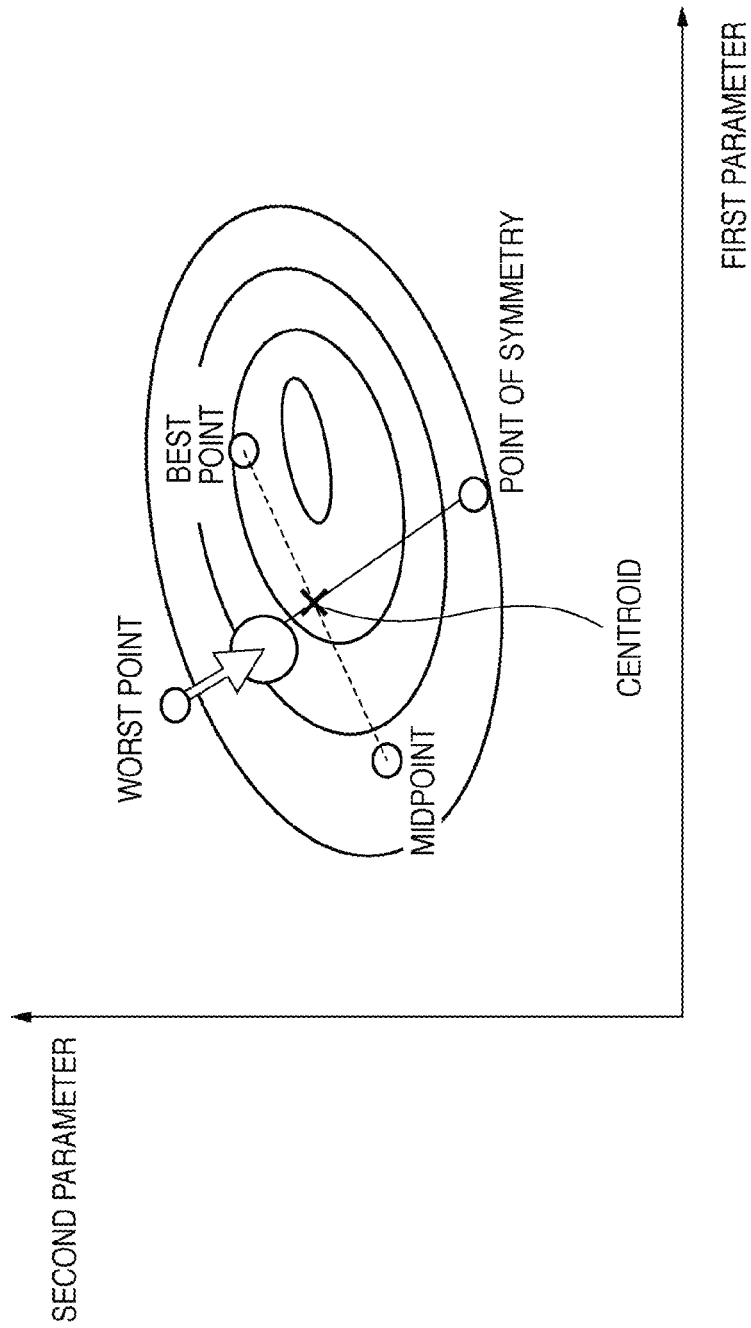
FIG. 5 is a diagram for explaining a downhill simplex method as one example of parameter optimization methods.

A downhill simplex method will be explained as one example of parameter optimization methods with reference to FIG. 5. Note that parameters to be optimized are two, a first parameter and a second parameter. First, three sets of a first parameter and a second parameter which have different values are temporarily determined. The values of the evaluation items are obtained for each of these three sets, and a best point at which the values of the evaluation items are best, the worst point at which the values of the evaluation items are worst, and the midpoint between the best point and the worst point are obtained. Also, the centroid of two, the best point and midpoint is obtained, and the point of symmetry of the worst point about the centroid is obtained. A fourth point is set between the worst point and the point of symmetry. The position to set the fourth point is determined by a certain constant. The same operation is performed at three, the best point, midpoint, and fourth point. The first parameter and the second parameter are optimized by repeating that operation. The number of sets of a first parameter and a second parameter temporarily determined first is typically n+1 when the number of parameters to be optimized is n.

Figure 6C:
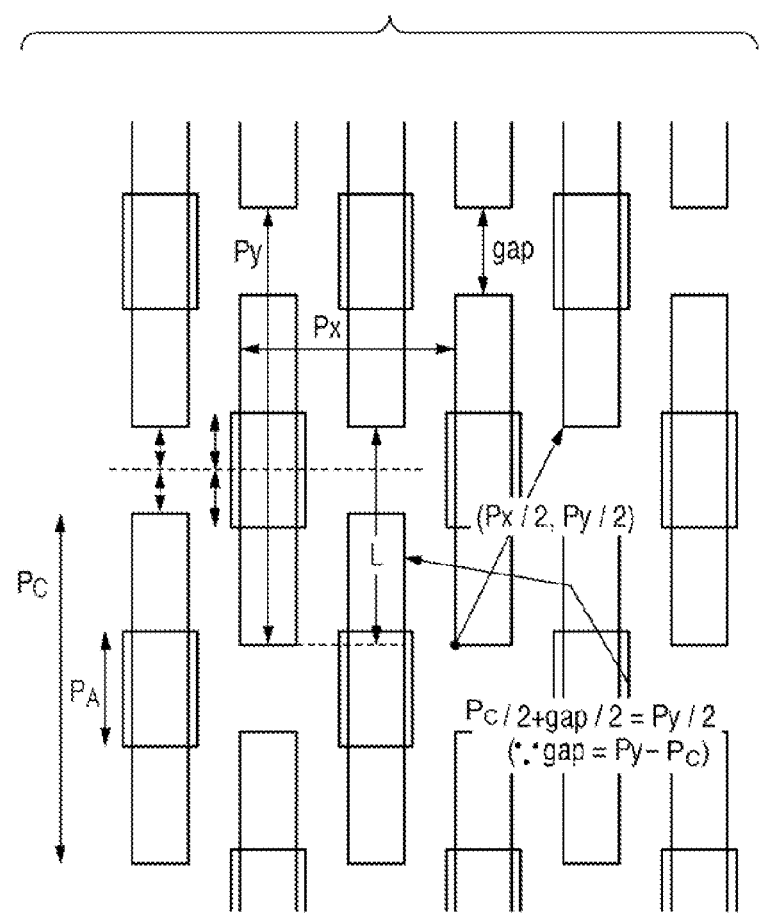
FIG. 6C is a view showing the entire device layout.

A pattern parameter setting method will be explained next. FIG. 6A is a view showing pattern parameters for the target pattern shown in FIG. 2A, the representative values of these pattern parameters, and the pitches of target patterns in the x and y directions. FIG. 6B is a view showing the result of expressing the vertices of two rectangles which form the target pattern shown in FIG. 2A as functions using the side lengths $P_A$, $P_B$, $P_C$, and $P_D$ of these two rectangles assuming (x0, y0) as the center of point symmetry. With this expression, point symmetry as a feature of the target pattern does not deteriorate even when the values of the pattern parameters ($P_A$ to $P_D$) are changed independently. FIG. 6C is a view showing the entire device layout, in which target patterns are arranged periodically. In FIG. 6C, reference symbol Px denotes the pitch of the target patterns in the x direction, and Py denotes the pitch of the target patterns in the y direction. Also, since $L=P_C/2+gap/2=Py/2$ (i.e., a $gap=Py-P_C$), adjacent target patterns are spaced apart from each other by a vector (Px/2, Py/2). Then, target patterns are arranged at an interval of Px/2 in the x direction and an interval of Py/2 in the y direction by giving an offset of Px/2 in the x direction and an offset of Py/2 in the y direction to the coordinates of one target pattern to obtain those of its adjacent target pattern, thus forming the entire layout. In other words, the entire layout is mathematically expressed using the pattern representative position (x0, y0), the side lengths $P_A$, $P_B$, $P_C$, and $P_D$ of the two rectangles which form the target pattern, and the pitches $P_X$ and $P_y$ of the target patterns. With this expression, periodicity as a feature of the target patterns does not deteriorate even when the values of the pattern parameters ($P_A$ to $P_D$) are changed independently, as described above.

Note that the basic concept of a device is often lost when the side lengths of the two rectangles which form the target pattern are merely optimized as pattern parameters. It is therefore necessary to set pattern parameters so as not to lose the basic concept of a device.

Note also that the pattern representative position (x0, y0) is not a direct optimization target in optimizing the mask pattern. The pitch of the target patterns may be an optimization target but is a fundamental quantity which determines the degree of minuteness of a device and therefore is typically a fixed value. Accordingly, the optimization targets are figure parameters expressed by, for example, the side lengths of a polygon. Although these figure parameters may be arbitrarily set, they are desirably simply set without setting large degrees of freedom for them. This is because, as described above, a simple pattern can be satisfactorily used to form a target pattern with a sufficiently high accuracy in this embodiment, and is cost-effective.

The difference between the technique disclosed in Japanese Patent Laid-Open No. 2004-079714 and a method of determining the pattern of a mask and the illumination shape with which the mask is illuminated in this embodiment will be explained. The technique disclosed in Japanese Patent Laid-Open No. 2004-079714 also expresses the mask pattern by pattern parameters and changes the pattern parameters to form a plurality of patterns. However, the plurality of patterns are used to form separate transfer patterns, so they do not commonly have the pattern characteristics of one device. The pattern includes a plurality of simple patterns, which are constituent elements of the pattern. Therefore, the correlation between the plurality of patterns is, for example, the simple pitch, and this means that they do not have the pattern characteristics of one device.

Also, the technique disclosed in Japanese Patent Laid-Open No. 2004-079714 optimizes the aperture, and this aperture optimization is the same concept as in illumination shape optimization. However, the technique disclosed in Japanese Patent Laid-Open No. 2004-079714 fixes the mask patterns (one or a plurality of mask patterns may be used), and selects an aperture optimum for the mask patterns. In contrast, in this embodiment, the mask pattern is not fixed and both the mask pattern and the illumination shape are optimized to come close to the target pattern while being changed.

<Second Embodiment>

Both the pattern of a mask and the illumination shape with which the mask is illuminated are determined (optimized) in the first embodiment. However, since the pattern parameters reflect the device characteristics, it is possible to yield a significant result even by determining only the pattern parameters while the illumination shape is fixed.

In actual device manufacture, one exposure apparatus processes a plurality of devices. When the exposure apparatus is of an old type, the number of illumination shapes that can be formed by the exposure apparatus is undesirably limited. In this case, it is also effective to optimize only the mask pattern while the illumination shape is fixed. When, for example, the device to be processed is a memory cell, assurance of a given dimensional balance among a plurality of positions in the pattern of the memory cell is of prime importance. It is therefore effective especially in this case to optimize only the mask pattern while the illumination shape is fixed. Although the pattern can also be optimized by adopting OPC, this method is inferior to the determination method according to this embodiment in respect of dimensional precision at a plurality of positions and mask pattern simplicity, as described above.

In the second embodiment, as shown in FIG. 7A, a quadrupole illumination shape is used and the illumination shape parameters are fixed to $P_a=0.8$, $P_b=0.2$, and $P_\phi=40$. Note that the target pattern was the same (FIG. 2A) as in the first embodiment.

With this setting, a parameter space ($P_A$, $P_B$, $P_C$, $P_D$) including the pattern parameters was formed (i.e., the illumination shape parameters $P_a$, $P_b$, and $P_\phi$ were fixed) to optimize them. The optimized pattern parameters were $P_A=118.1$ nm, $P_B=98.8$ nm, $P_C=412.5$ nm, and $P_D=50.0$ nm, as shown in FIG. 7B.

FIG. 7C shows a pattern image (transfer pattern) formed on the image plane of a projection optical system upon illuminating the pattern defined by the pattern parameters, shown in FIG. 7B, with the illumination shape defined by the illumination shape parameters, shown in FIG. 6A. Also, FIG. 7D shows the result of superposing the pattern defined by the pattern parameters, shown in FIG. 7B, and the pattern image shown in FIG. 7C on each other. Referring to FIGS. 7C and 7D, the differences between the dimensions of the transfer pattern and their target values were 1.13 nm at an evaluation position EP1, 4.97 nm at an evaluation position EP2, and 0.43 nm at an evaluation position EP3. Also, the overall rms was 2.95 nm. Although the results obtained in this embodiment are poorer than those (see FIG. 3C) obtained in the first embodiment, they are nearly equal to those (FIG. 4B)

obtained when OPC is adopted and this means that a significant result was obtained in this embodiment considering mask pattern simplicity.

<Third Embodiment>

To reduce the size of a memory cell, a pattern oblique with respect to the coordinate axes is often used as the pattern of the memory cell in a leading-edge DRAM isolation process. Although OPC needs to be applied even to the oblique pattern in order to attain a predetermined dimensional precision, it is very difficult to apply OPC to the oblique pattern.

Figure 8A:
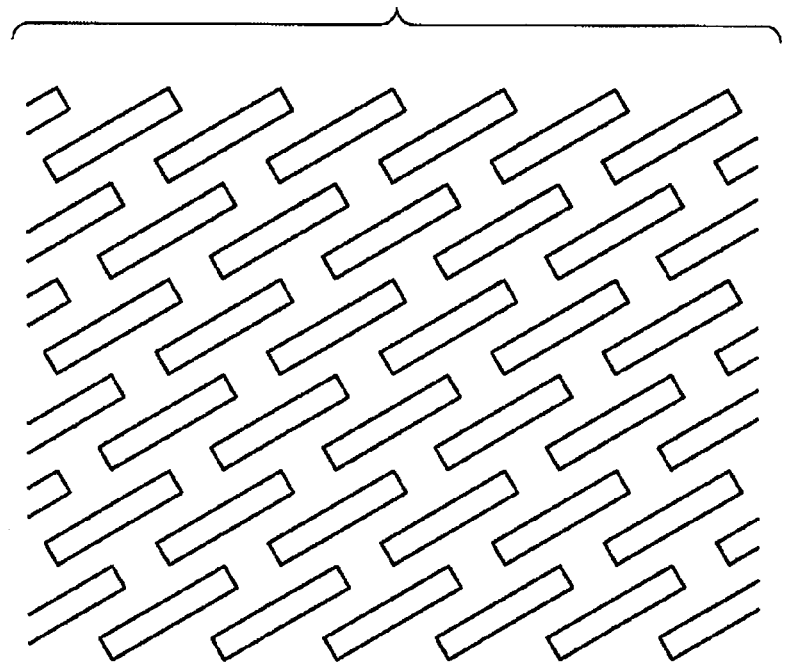
FIG. 8A is a view showing a target pattern (its shape) in the third embodiment.

The third embodiment will exemplify an oblique pattern as the target pattern. FIG. 8A is a view showing a target pattern (its shape) in the third embodiment. Referring to FIG. 8A, the oblique angle of the target pattern is 30° and target patterns are arranged so as to maintain a given periodicity over the entire layout. Note that the pitches between adjacent target patterns in the widthwise and longitudinal directions are 90 nm and 312 nm, respectively.

Side lengths $P_A$, $P_B$, $P_C$, and $P_D$ of the two rectangles were set as pattern parameters, as shown in FIG. 8B, for the target pattern in the third embodiment. Note that the rectangles which are defined by the lengths $P_C$ and $P_D$ and arranged at the two ends of the base rectangle defined by the lengths $P_A$ and $P_B$ are called hammerheads and have a function of preventing shrinkage of a transfer pattern.

Also, the illumination shape (its basic shape) with which the mask is illuminated is a quadrupole shape that is rotated by 30° in correspondence with the oblique angle of the target pattern, as shown in FIG. 8C. $P_a$, $P_b$, $P_{\phi1}$, and $P_{\phi2}$ are set as illumination shape parameters for the illumination shape in the third embodiment, as shown in FIG. 8C. The rotation angle of the illumination shape is not set as an illumination shape parameter. The polarization direction in the illumination shape shown in FIG. 8C is the direction of tangential polarization.

Optimization (determination) of the mask pattern and illumination shape when the wavelength of exposure light is 193 nm and the numerical aperture (NA) of a projection optical system is 1.35 for the target pattern shown in FIG. 8A and the illumination shape (temporary illumination shape) shown in FIG. 8C will be explained. The evaluation positions to evaluate an image of a temporary pattern corresponding to the target pattern were set to evaluation positions EP1, EP2, and EP3, as shown in FIG. 8F, and the evaluation items were set to the dimensions of the image of the temporary pattern. Note that the ideal dimensions (target values) at the evaluation positions EP1, EP2, and EP3 are 44 nm, 44 nm, and 50 nm, respectively.

Taking account of the device characteristics and the mask productivity, the limit ranges of the pattern parameters were set to 30 nm<$P_A$<70 nm, 230 nm<$P_B$<280 nm, −12 nm<$P_C$<12 nm, and 10 nm<$P_D$<90 nm. Also, the limit ranges of the illumination shape parameters were set to 0.6<$P_a$<0.95, 0.05<$P_b$<0.3, 5°<$P_{\phi1}$<150°, and 5°<$P_{\phi2}$<150°.

With this setting, a parameter space ($P_A$, $P_B$, $P_C$, $P_D$, $P_a$, $P_b$, $P_{\phi1}$, $P_{\phi2}$) including the pattern parameters and illumination shape parameters was formed to optimize them. The optimized pattern parameters were $P_A$=44 nm, $P_B$=230 nm, $P_C$=8.4 nm, and $P_D$=38 nm, as shown in FIG. 8D. The optimized illumination shape parameters were $P_a$=0.925, $P_b$=0.075, $P_{\phi1}$=5, and $P_{\phi2}$=70, as shown in FIG. 8E.

FIG. 8F shows the result of superposing on each other the pattern defined by the pattern parameters, shown in FIG. 8D, and a pattern image (transfer pattern) formed upon illuminating the pattern shown in FIG. 8D with the illumination shape defined by the illumination shape parameters, shown in FIG. 8E. Referring to FIG. 8F, the differences between the dimensions of the transfer pattern and their target values were 0.007 nm at the evaluation position EP1, −0.16 nm at the evaluation position EP2, and 0.04 nm at the evaluation position EP3. Also, the overall rms was 0.09 nm and this means that a very good optimization result was obtained in this embodiment. As described above, since it is very difficult to apply OPC to an oblique pattern, the transfer pattern is not compared with that by the mask pattern obtained by applying OPC to the target pattern shown in FIG. 8A. However, it is very significant that the above-mentioned result was obtained for an oblique pattern which is very hard to apply OPC.

A pattern parameter setting method will be explained herein. FIG. 9A is a view showing the result of expressing the vertices of rectangles which form the target pattern shown in FIG. 8A as functions using the side lengths $P_A$, $P_B$, $P_C$, and $P_D$ of the rectangles assuming the origin (the intersection between the x- and y-axes) as zero point. Note that the hammerheads are in contact with the short sides of the base rectangle and have symmetry as a whole.

FIG. 9B is a view showing the periodicity of four target patterns. In FIG. 9B, reference symbols PitchX and PitchY denote the pitches of the target patterns in the longitudinal and widthwise directions, respectively. To regularly arrange the target patterns in the longitudinal and widthwise directions, it is necessary to determine the coordinates of positions PT1 to PT3 in the following way. First, the coordinates of the position PT1 are determined as (PitchY/sin θ, 0) from the information of PitchY. The coordinates of the position PT2 are determined as (PitchX·cos θ, PitchX·sin θ) from the information of PitchX. The coordinates of the position PT3 are determined as (PitchX·cos θ−PitchY/sin θ, PitchX·sin θ) from the coordinates of the positions PT1 and PT2. When four target patterns tangent to the origins are arranged in their longitudinal and widthwise directions based on the above-mentioned relationship, this arrangement can have periodicity.

Figure 9C:
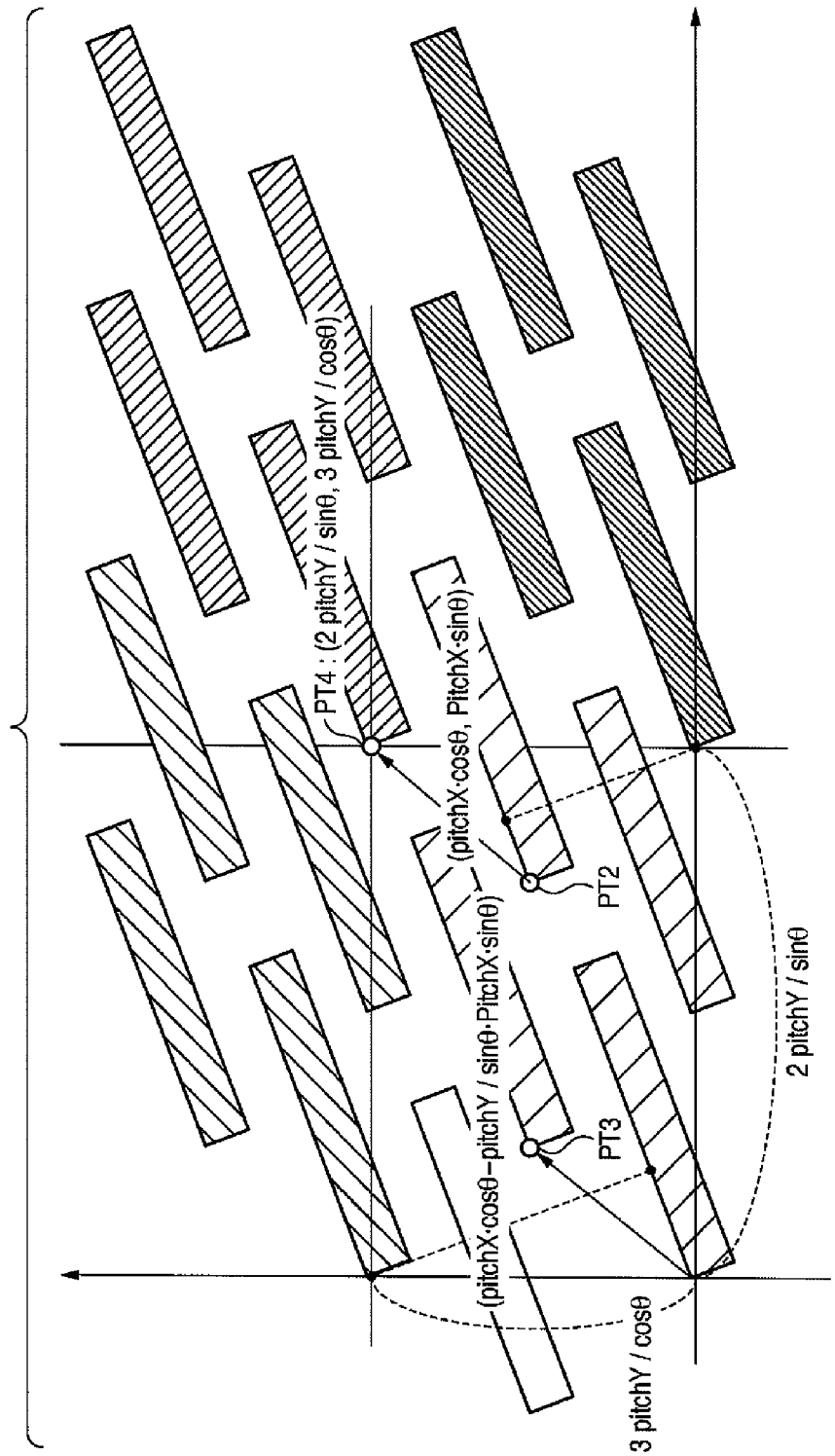
FIG. 9C is a view for explaining the pattern parameter setting method according to the third embodiment.

To form the entire layout, it is only necessary to repeatedly arrange four target patterns (FIG. 9B), as shown in FIG. 9C. Assuming four target patterns as one set, the pitches of sets of four target patterns in the x and y directions are determined as 2PitchY/sin θ and 3PitchY/cos θ using the information of 2PitchY. Then, the coordinates of a position PT4 are determined as (2PitchY/sin θ, 3PitchX/cos θ). From the periodicity of the entire layout, the vector which connects the origin and the position PT3 is equal to that which connects the positions PT2 and PT3. Hence, PitchX and PitchY have a relation PitchX=1.5×PitchY/(sin θ·cos θ) between them. With this expression, a feature of the entire layout does not deteriorate even when the pattern parameters ($P_A$ to $P_D$) are changed independently.

<Fourth Embodiment>

Fixed focus (typically, best focus) is assumed in the first to third embodiments. However, the focus is unstable in practice and this makes it important to take account of the defocus characteristic.

The target pattern, the illumination shape, and the evaluation positions to evaluate an image of a temporary pattern corresponding to the target pattern in the fourth embodiment were the same as in the first embodiment. However, note that, in the fourth embodiment, the defocus range in which the rms of the differences (dimensional errors) between the evaluation values at three evaluation positions and their target values is smaller than a standard value was set as an evaluation item evaluated at the evaluation positions. The standard value of the rms was set to 5 nm by taking account of the dimensional standard according to which a device can operate stably.

The limit ranges of the pattern parameters were set to 80 nm<$P_A$<120 nm, 90 nm<$P_B$<120 nm, 380 nm<$P_C$<460 nm, and 40 nm<$P_D$<60 nm. Also, the limit ranges of the illumination shape parameters were set to 0.90<$P_a$<1.00, 0.05<$P_b$<0.4, and 20°<$P_\phi$<70°.

With this setting, a parameter space ($P_A$, $P_B$, $P_C$, $P_D$, $P_a$, $P_b$, $P_\phi$) including the pattern parameters and illumination shape parameters was formed to optimize them. The optimized illumination shape parameters were $P_a$=0.915, $P_b$=0.132, and $P_\phi$=40, as shown in FIG. 10A. The optimized pattern parameters were $P_A$=90.0 nm, $P_B$=100.0 nm, $P_C$=400.0 nm, and $P_D$=41.3 nm, as shown in FIG. 10B.

FIG. 10C shows a pattern image (transfer pattern) formed on the image plane of a projection optical system upon illuminating the pattern defined by the pattern parameters, shown in FIG. 10B, with the illumination shape defined by the illumination shape parameters, shown in FIG. 10A. Also, FIG. 10D shows the result of superposing the pattern defined by the pattern parameters, shown in FIG. 10B, and the pattern image shown in FIG. 10C on each other. The result shown in FIGS. 10A to 10D is obtained when the defocus characteristic is taken into consideration, whereas that shown in FIGS. 3A and 3D is obtained when the defocus characteristic is not taken into consideration. As can be seen from a comparison between FIGS. 10A to 10D and FIGS. 3A to 3D, the mask pattern and the illumination shape differ between a case in which the defocus is taken into consideration and that in which the defocus is not taken into consideration.

Figure 10E:
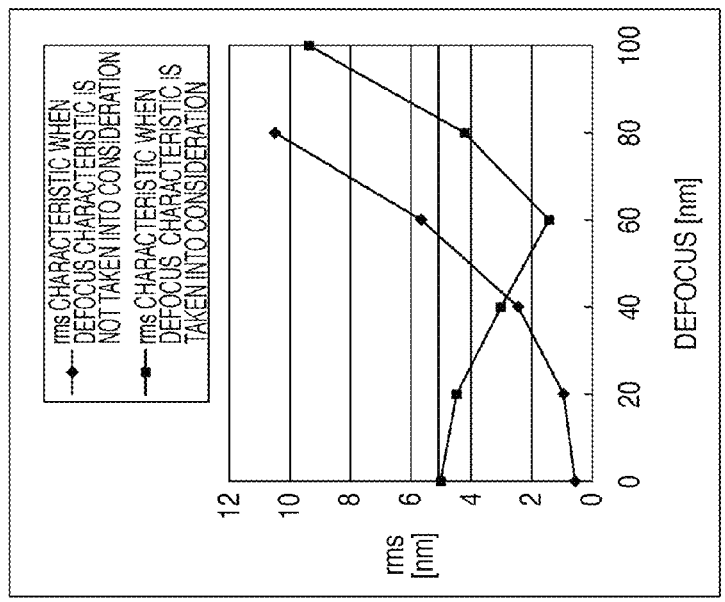
FIG. 10E is a graph showing the defocus characteristics of the pattern defined by the pattern parameters, shown in FIG. 10B, and the pattern defined by the pattern parameters, shown in FIG. 3B.
Figure 10D:
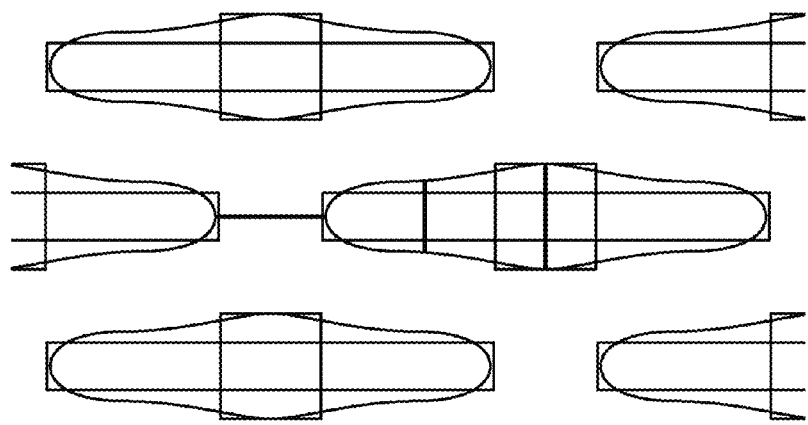
FIG. 10D is a view showing the result of superposing the pattern defined by the pattern parameters, shown in FIG. 10B, and the pattern image shown in FIG. 10C on each other.

FIG. 10E shows the defocus characteristic of the pattern defined by the pattern parameters, shown in FIG. 10B (when the defocus is taken into consideration), and that of the pattern defined by the pattern parameters, shown in FIG. 3B (when the defocus is not taken into consideration). Referring to FIG. 10E, when the defocus characteristic is not taken into consideration, the rms is favorably as low as 0.5 nm in a best focus state but rapidly increases as the defocus increases. In contrast to this, when the defocus characteristic is taken into consideration, the rms is 4.9 nm that slightly falls below the standard value but does not unfavorably increase even as the defocus increases. As the defocus amount exceeds 40 nm, the rms when the defocus characteristic is taken into consideration becomes smaller than that when the defocus characteristic is not taken into consideration. Moreover, the defocus amount which meets the standard value (5 nm) is 62 nm when the defocus characteristic is not taken into consideration, and is 83 nm when the defocus characteristic is taken into consideration, and this means that the tolerance when the defocus characteristic is taken into consideration is relatively high. An improvement in defocus characteristic as in this case is effective in actual device fabrication.

Figure 11:
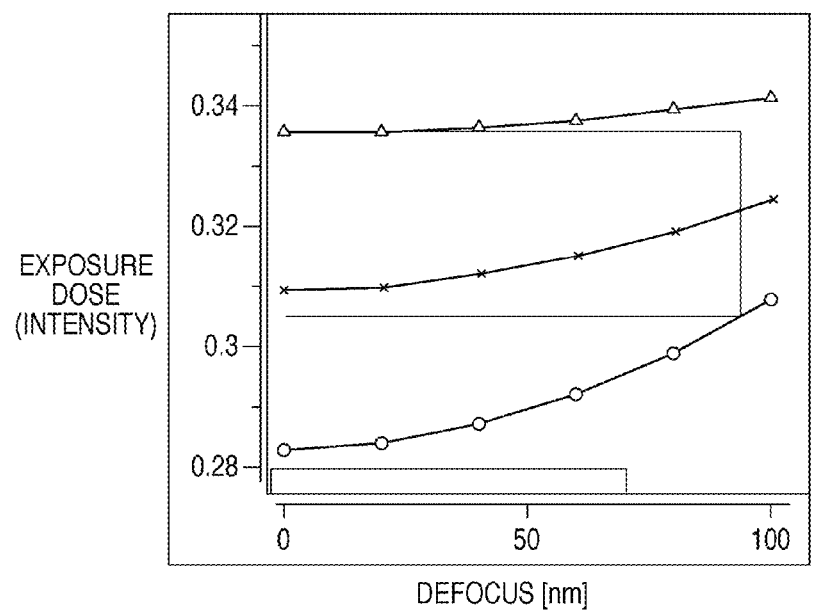
FIG. 11 is a graph for explaining an exposure dose—focus window.

Although the defocus characteristic is set as an evaluation item in this embodiment, the exposure dose and focus range (exposure dose—focus window) in which a dimensional change (exposure dose margin) for the exposure dose and the defocus, for example, may be set as an evaluation item. An exposure dose—focus window will be explained with reference to FIG. 11. In FIG. 11, the upper curve indicates the exposure dose and focus for which the dimension is (standard value)+10%, the lower curve indicates the exposure dose and focus for which the dimension is (standard value)−10%, and the middle curve indicates the exposure dose and focus for which the dimension is the standard value. In this case, an exposure dose—focus window is set as an evaluation item by setting a rectangle inscribed in the upper and lower curves in order to digitize that window.

<Fifth Embodiment>

The target pattern includes one type of pattern in the first to fourth embodiments. However, the target pattern may include a plurality of types of patterns as long as it bears the information of, for example, a small circuit block as in a memory cell of an SRAM.

Figure 12A:
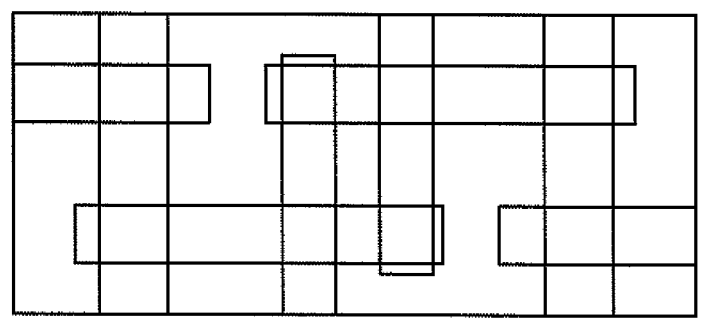
FIG. 12A is a view showing the pattern (its shape) of a memory cell in SRAM isolation and gate processes.

An example of the target pattern including a plurality of types of patterns is the pattern of a memory cell in SRAM isolation and gate processes as shown in FIG. 12A. The pattern shown in FIG. 12A includes a pattern in the isolation process (see FIG. 12B) and that in the gate process (see FIG. 12C).

Figure 12B:
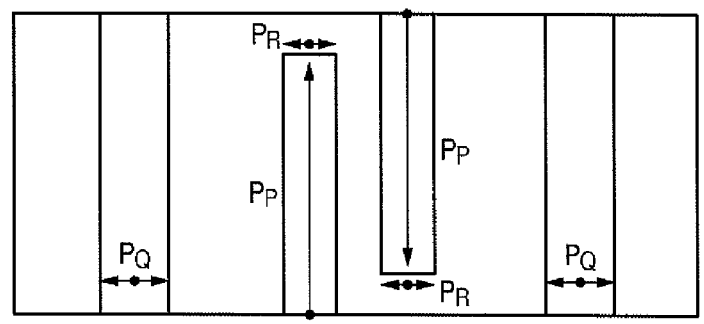
FIG. 12B is a view showing pattern parameters which can be set for the patterns used in the isolation process of the patterns shown in FIG. 12A.
Figure 12C:
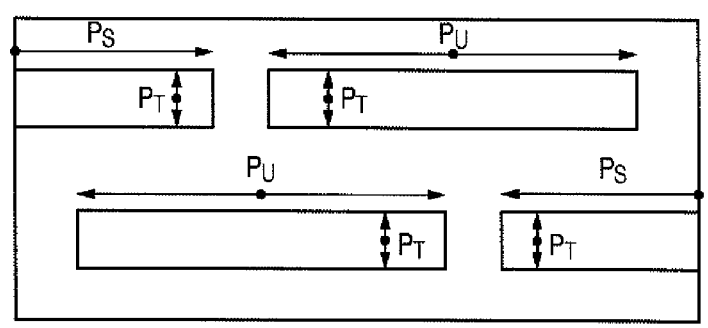
FIG. 12C is a view showing pattern parameters which can be set for the patterns used in the gate process of the patterns shown in FIG. 12A.

$P_P$, $P_Q$, and $P_R$ can be set as pattern parameters for the pattern in the isolation process, as shown in FIG. 12B. Also, $P_S$, $P_T$, and $P_U$ can be set as pattern parameters for the pattern in the gate process, as shown in FIG. 12C. Referring to FIGS. 12B and 12C, although pattern parameters set for each pattern are fewer than the sides of a rectangle which forms each pattern, the entire layout can be expressed by the above-mentioned pattern parameters by taking advantage of pattern symmetry. In FIGS. 12B and 12C, the pattern parameters are indicated by arrows, and the lengths of the dimensions indicated by the arrows are changed (adjusted) while the starting points or midpoints of the arrows are fixed. This is to hold a given overlay relationship between the pattern in the isolation process and that in the gate process.

Figure 13:
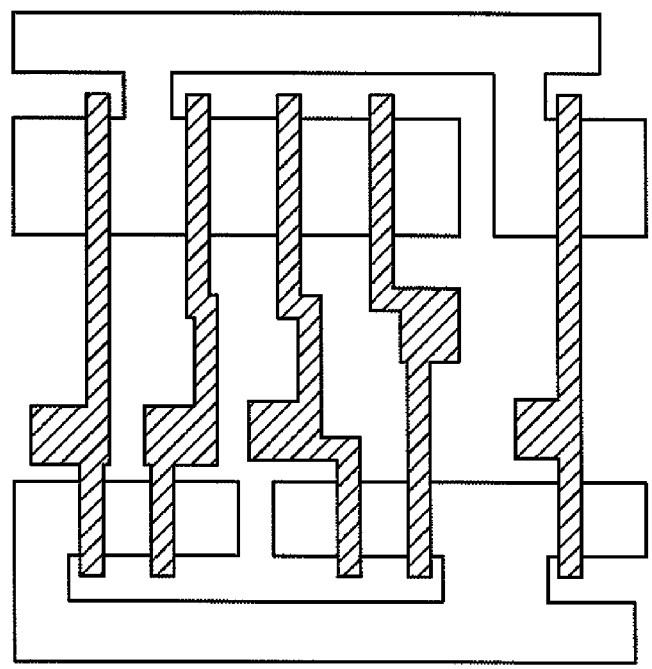
FIG. 13 is a view showing the pattern (its shape) of a standard library cell.

Another example of the target pattern including a plurality of types of patterns is the pattern of a standard library cell used in a logic device as shown in FIG. 13. The pattern shown in FIG. 13 includes a pattern in the isolation process and that in the gate process. Referring to FIG. 13, the pattern in the isolation process and that in the gate process each can include a plurality of polygons. Hence, the determination method according to this embodiment is applicable to these patterns.

A logic device includes a plurality of standard library cells. Of these cells, the pattern parameters of each standard library cell in a small-scale local circuit block are grouped as one pattern parameter of that circuit block. This makes it possible to suppress an enormous increase in number of pattern parameters.

At the same time, as the number of pattern parameters in the pattern of a standard library cell is prone to increase in practice, these pattern parameters may converge into not true optimum solutions but solutions close to them and the computation time may prolong. Nevertheless, the above-mentioned problems can be solved because the number of pattern parameters can be reduced as long as the layout is limited on a grid. The grid means herein a grid-like coordinate system on a plane in which a layout is designed, and the vertices of polygons are located in the coordinate system. Also, the rules to express the entire layout are simple and few. More specifically, the number of types of characteristics such as the pitch and line width is small and may be even one. Hence, the number of parameters is reduced.

<Sixth Embodiment>

Figure 14:
FIG. 14 is a circuit diagram illustrating one example of an electrical circuit converted from a mask pattern.

The electrical characteristics of a circuit block of, for example, a memory cell or a standard library cell can also be used as evaluation items evaluated at the evaluation positions in an image (transfer pattern) of a temporary pattern. Since the shape of the transfer pattern is intermediate data to obtain the electrical characteristics, the dimensions at positions corresponding to, for example, the length and width of a transistor can be obtained from the transfer pattern. The dimensions at positions required to obtain the wiring resistance and capacity are obtained from the transfer pattern as well. Hence, the mask pattern can be converted into an electrical circuit as shown in FIG. 14, from which the electrical characteristics are derived. The electrical characteristics include, for example, timing, signal correctness, power, and noise. As a result, the electrical characteristics can be expressed by both layout parameters and illumination shape parameters which define the illumination shape. Then, the electrical characteristics can be optimized by optimizing the layout parameters and illumination shape parameters.

In this optimization, the dimensions of a pattern designed initially (i.e., the target pattern) do not always correspond to best electrical characteristics. In other words, dimensions different from those of a pattern designed initially may correspond to best electrical characteristics. OPC can be used to optimize only the mask pattern so that the transfer pattern matches the target pattern, so it cannot be used to optimize the device characteristics (e.g., optimize the electrical characteristics), unlike the determination method according to this embodiment.

The present invention is also implemented by a process of supplying software (program) which implements the functions of the above-mentioned embodiments to a system or apparatus via a network or various kinds of storage media and reading out the program by the computer (or, e.g., a CPU or an MPU) of the system or apparatus.

Although preferred embodiments of the present invention have been described above, the present invention is not limited to these embodiments, and various modifications and changes can be made without departing from the spirit and scope of the present invention.

What is claimed is:

1. A non-transitory computer-readable recording medium recording a program for causing a computer to execute a method of determining a pattern of a mask and an effective light source distribution with which the mask is illuminated, both of which are used for an exposure apparatus including an illumination optical system which illuminates a mask with light from a light source and a projection optical system which projects a pattern of the mask onto a substrate, the program causing the computer to execute:
   a first setting step of setting a first parameter to define a shape of a temporary pattern corresponding to a pattern to be formed on the substrate, the shape of the temporary pattern being matched with a shape formed by a combination of a plurality of polygons, and each of side lengths of the plurality of polygons being set as the first parameter;
   a second setting step of setting an evaluation position, to evaluate an image of the temporary pattern formed on an image plane of the projection optical system, in the image of the temporary pattern, and an evaluation item evaluated at the evaluation position;
   a third setting step of setting a second parameter to define a temporary effective light source distribution;
   a temporary determination step of temporarily determining a value of the first parameter and a value of the second parameter;
   a first obtaining step of obtaining an image of the temporary pattern formed on the image plane of the projection optical system upon illuminating, the temporary pattern defined by the value of the first parameter temporarily determined in the temporary determination step, with the temporary effective light source distribution defined by the value of the second parameter temporarily determined in the temporary determination step;
   a second obtaining step of obtaining, a value of the evaluation item evaluated at the evaluation position set in the second setting step, for the image of the temporary pattern obtained in the first obtaining step; and
   a decision step of deciding whether the value of the evaluation item evaluated at the evaluation position, obtained in the second obtaining step, satisfies an evaluation reference,
   wherein
   if it is decided in the decision step that the value of the evaluation item evaluated at the evaluation position satisfies the evaluation reference, the temporary pattern defined by the value of the first parameter temporarily determined in the temporary determination step, and the temporary effective light source distribution defined by the value of the second parameter temporarily determined in the temporary determination step are determined as the pattern of the mask and the effective light source distribution, respectively, and
   if it is decided in the decision step that the value of the evaluation item evaluated at the evaluation position does not satisfy the evaluation reference, a process returns to the temporary determination step, in which the value of the first parameter and the value of the second parameter are temporarily determined again, and the first obtaining step, the second obtaining step, and the decision step are repeated.

2. The medium according to claim 1, wherein the evaluation item evaluated at the evaluation position includes at least one of a dimension of the image of the temporary pattern, a defocus characteristic of the image of the temporary pattern, a dimensional change of the image of the temporary pattern for an exposure dose, and an exposure dose and focus range in which the image of the temporary pattern meets a standard.

3. The medium according to claim 1, wherein the pattern to be formed on the substrate is one of a pattern of a standard library cell and a pattern of a memory.

4. The recording medium according to claim 1, wherein the plurality of polygons is constituted to include an overlap region that overlaps each other.

5. A computer-implemented method of determining a pattern of a mask and an effective light source distribution with which the mask is illuminated, both of which are used for an exposure apparatus including an illumination optical system which illuminates a mask with light from a light source and a projection optical system which projects a pattern of the mask onto a substrate, executing the following steps by at least one computer, the method comprising:
   a first setting step of setting a first parameter to define a shape of a temporary pattern corresponding to a pattern to be formed on the substrate, the shape of the temporary pattern being matched with a shape formed by a combination of a plurality of polygons, and each of side lengths of the plurality of polygons being set as the first parameter;
   a second setting step of setting an evaluation position, to evaluate an image of the temporary pattern formed on an image plane of the projection optical system, in the image of the temporary pattern, and an evaluation item evaluated at the evaluation position;
   a third setting step of setting a second parameter to define a temporary effective light source distribution;
   a temporary determination step of temporarily determining a value of the first parameter and a value of the second parameter;
   a first obtaining step of obtaining an image of the temporary pattern formed on the image plane of the projection optical system upon illuminating, the temporary pattern defined by the value of the first parameter temporarily determined in the temporary determination step, with the temporary effective light source distribution defined by the value of the second parameter temporarily determined in the temporary determination step;

a second obtaining step of obtaining, a value of the evaluation item evaluated at the evaluation position set in the second setting step, for the image of the temporary pattern obtained in the first obtaining step; and a decision step of deciding whether the value of the evaluation item evaluated at the evaluation position, obtained in the second obtaining step, satisfies an evaluation reference, wherein if it is decided in the decision step that the value of the evaluation item evaluated at the evaluation position satisfies the evaluation reference, the temporary pattern defined by the value of the first parameter temporarily determined in the temporary determination step, and the temporary effective light source distribution defined by the value of the second parameter temporarily determined in the temporary determination step are determined as the pattern of the mask and the effective light source distribution, respectively, and if it is decided in the decision step that the value of the evaluation item evaluated at the evaluation position does not satisfy the evaluation reference, a process returns to the temporary determination step, in which the value of the first parameter and the value of the second parameter are temporarily determined again, and the first obtaining step, the second obtaining step, and the decision step are repeated.

6. A computer-implemented method of determining a pattern of a mask and an effective light source distribution with which the mask is illuminated, both of which are used for an exposure apparatus including an illumination optical system which illuminates a mask with light from a light source and a projection optical system which projects a pattern of the mask onto a substrate, executing the following steps by at least one computer, the method comprising:

a temporary determination step of temporarily determining a value of a first parameter which defines a shape of a temporary pattern corresponding to a pattern to be formed on the substrate, and a value of a second parameter which defines a temporary effective light source distribution, the shape of the temporary pattern being matched with a shape formed by a combination of a plurality of polygons, and each of side lengths of the plurality of polygons being set as the first parameter;

a setting step of setting an evaluation position in an image of the temporary pattern formed on an image plane of the projection optical system, and an evaluation item evaluated at the evaluation position;

a calculation step of calculating an image of the temporary pattern formed on the image plane of the projection optical system upon illuminating, the temporary pattern defined by the value of the temporarily determined first parameter, with the temporary effective light source distribution defined by the value of the temporarily determined second parameter, and calculating a value of the evaluation item for the calculated image of the temporary pattern; and a step of determining the temporary pattern and the temporary effective light source distribution as the pattern of the mask and the effective light source distribution, respectively, when the calculated value of the evaluation item satisfies an evaluation reference.

7. A non-transitory computer-readable recording medium recording a program for causing a computer to execute a method according to claim 6.

* * * * *